United States Patent
Chou et al.

(10) Patent No.: US 7,378,341 B2
(45) Date of Patent: May 27, 2008

(54) AUTOMATIC PROCESS CONTROL OF AFTER-ETCH-INSPECTION CRITICAL DIMENSION

(75) Inventors: Pei-Yu Chou, Taipei Hsien (TW); Wen-Chou Tsai, Tao-Yuan (TW); Jiunn-Hsiung Liao, Tainan Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 71 days.

(21) Appl. No.: 11/382,060

(22) Filed: May 8, 2006

(65) Prior Publication Data

US 2007/0259527 A1    Nov. 8, 2007

(51) Int. Cl.
*H01L 21/4763* (2006.01)

(52) U.S. Cl. ............... 438/637; 438/197; 438/672; 438/700; 257/E21.17; 257/E21.29; 257/E21.245; 257/E21; 257/304; 257/E21.585; 257/E21.645

(58) Field of Classification Search ........... 438/637, 438/700, 197, 238, 680, 692, 706, 740, 755, 438/756, 757, 672
See application file for complete search history.

(56) References Cited

U.S. PATENT DOCUMENTS

| 5,378,317 | A  |  | 1/1995  | Kashiwase |
|---|---|---|---|---|
| 5,674,357 | A  |  | 10/1997 | Sun |
| 5,976,968 | A  |  | 11/1999 | Dai |
| 6,309,976 | B1 | * | 10/2001 | Lin et al. ............. 438/706 |
| 2005/0059251 | A1 | * | 3/2005 | Kao et al. ............. 438/701 |
| 2007/0020921 | A1 | * | 1/2007 | Chu et al. ............. 438/637 |
| 2007/0155157 | A1 | * | 7/2007 | Chou et al. ............ 438/618 |
| 2007/0210454 | A1 | * | 9/2007 | Chou et al. ............ 257/758 |

* cited by examiner

*Primary Examiner*—David Nhu
(74) *Attorney, Agent, or Firm*—Winston Hsu

(57) ABSTRACT

Automatic process control of after-etch-inspection critical dimension. A dielectric layer is deposited over a substrate and is then planarized to a first thickness. A cap oxide layer having a second thickness is deposited, wherein the combination of the first thickness and the second thickness is substantially constant. An ADI CD of a contact hole to be formed on the substrate is altered and pre-determined based on the second thickness of the cap oxide layer. A photoresist layer is formed on the cap oxide layer. An opening having the predetermined ADI CD is formed in the photoresist layer. Using the photoresist layer as an etching mask, the cap oxide layer and the dielectric layer is etched through the opening to form a contact hole having an AEI CD.

36 Claims, 8 Drawing Sheets

AUTOMATIC PROCESS CONTROL OF AFTER-ETCH-INSPECTION CRITICAL DIMENSION

BACKGROUND OF THE INVENTION

1. Field of the Invention

The present invention relates to semiconductor fabrication processes. More particularly, the present invention relates to an after-etch-inspection critical dimension (AEI CD) control method for contact process.

2. Description of the Prior Art

In the fabrication of semiconductor devices, it is typical to use photoresist layer on a semiconductor wafer to mask a predetermined pattern for subsequent etching or ion implantation processes. The patterned photoresist is usually formed by, firstly, coating the photoresist, exposing it to suitable radiation (UV, EUV, e-beam, etc.), and then developing (and baking) the exposed photoresist. For positive-type photoresist, for example, the irradiated parts of the photoresist are chemically removed in the development step to expose areas of the underlying layer where are to be etched.

As known in the art, quality inspections are carried out after development and after etching, respectively, to ensure good quality of the device critical dimensions (CDs), which are also referred to as After-Develop-Inspection CD (ADI CD) and After-Etch-Inspection CD (AEI CD). These quality control procedures are designed to remedy any process anomaly in time.

As the feature size of the semiconductor devices shrinks, the difference between the ADI CD and AEI CD becomes larger. This turns out to be a serious problem when the device dimension shrinks to nano scale and beyond. In some circumstances, the AEI CD that is smaller than the ADI CD is required. For example, in the fabrication of contact holes of a SRAM device, the contact hole is in close proximity to the polysilicon gate. In such case, even very slight deviation of the AEI CD may result in short between the contact device and the gate, thus causing malfunction of the memory unit. It is desired to precisely control the AEI CD in order to improve product quality and reliability.

SUMMARY OF THE INVENTION

It is one object of the present invention to provide a method for automatically control the AEI CD in the fabrication of semiconductor devices.

According to the claimed invention, a method for controlling after-etch-inspection critical dimension (AEI CD) of a contact hole is provided. A dielectric layer is deposited over a substrate. A CMP process is performed to planarize the dielectric layer, wherein the remaining dielectric layer has a first thickness. A cap oxide layer having a second thickness is deposited, wherein the combination of the first thickness and the second thickness is substantially constant. Based on the second thickness of the cap oxide layer, an ADI CD of a contact hole to be formed on the substrate is altered and pre-determined. A photoresist layer is formed on the cap oxide layer. A lithographic process is performed to form an opening in the photoresist layer, wherein the opening has the pre-determined ADI CD. A dry etching process is performed using the photoresist layer as an etching hard mask to etch the cap oxide layer and the dielectric layer through the opening to form a contact hole therein, wherein the contact hole has an AEI CD.

From one aspect, a method for controlling after-etch-inspection critical dimension (AEI CD) of a contact hole is provided. A dielectric layer is deposited over a substrate. A CMP process is performed to planarize the dielectric layer, wherein the remaining dielectric layer has a first thickness. A cap oxide layer having a second thickness is deposited, wherein the combination of the first thickness and the second thickness is substantially constant. Based on the second thickness of the cap oxide layer, an ADI CD of a contact hole to be formed on the substrate and/or etching recipe for etching the contact hole is altered and pre-determined. A photoresist layer is formed on the cap oxide layer. A lithographic process is performed to form an opening in the photoresist layer, wherein the opening has the ADI CD. A dry etching process is performed using the photoresist layer as an etching hard mask to etch the cap oxide layer and the dielectric layer through the opening to form a contact hole therein, wherein the contact hole has an AEI CD.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
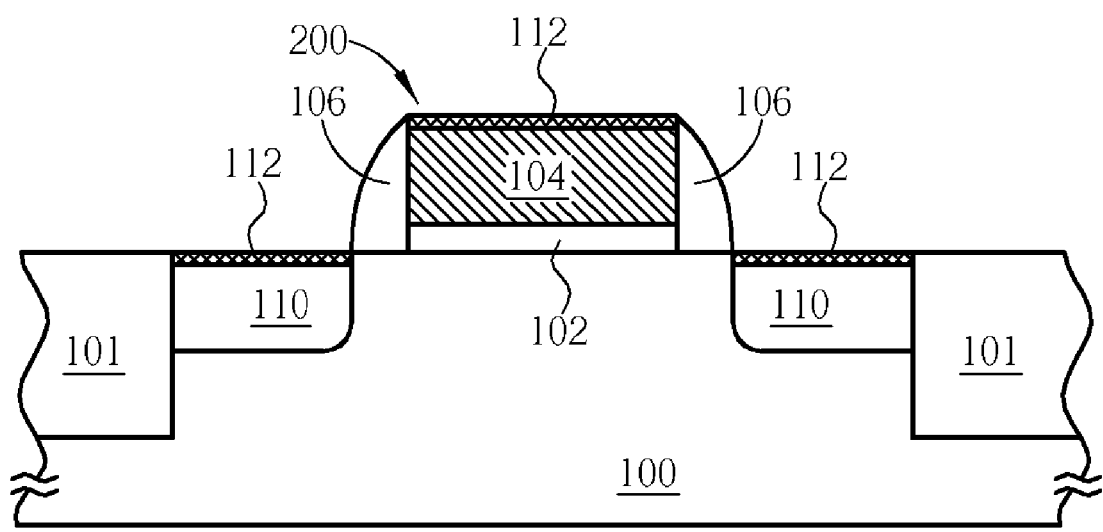
FIGS. 1-5 are schematic, cross-sectional diagrams illustrating the process steps of making a contact hole on a semiconductor substrate.

Please refer to FIGS. 1-5. FIGS. 1-5 are schematic, cross-sectional diagrams illustrating the process steps of making a contact hole on a semiconductor substrate 100. As shown in FIG. 1, at least one metal-oxide-semiconductor (MOS) transistor 200 is formed on the semiconductor substrate 100. The MOS transistor 200 comprises a gate dielectric layer 102 formed on an active area of the semiconductor substrate 100, a polysilicon gate 104 stacked on the gate dielectric layer 102, spacers 106 on respective sidewalls of the gate 104, and source/drain regions 110. Typically, a silicide layer or salicide layer 112 may be formed on the top of the gate 104 and on the source/drain regions 108 and 110 for reducing contact resistance.

According to the preferred embodiment, the MOS transistor 200 is electrically isolated with a shallow trench isolation (STI) region 101. According to the preferred embodiment, the MOS transistor 200 may be one of the multiple transistors of a SRAM device, but not limited thereto. The MOS transistor 200 may be transistor device of a logic circuit.

As known in the art, for standard contact process of a SRAM device, at least three contacts: Vcc contact, Nc contact and shared contact are formed on the semiconductor substrate. Among these contacts, the process window for the Nc contact is smallest because the position of the Nc contact hole is closest to the gate.

Figure 2:
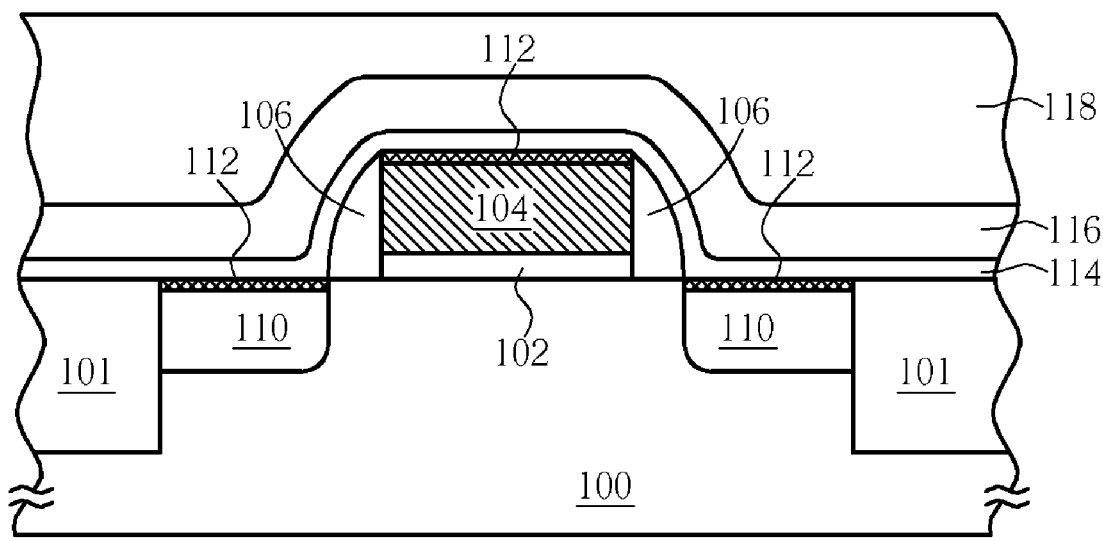

As shown in FIG. 2, a contact etch stop layer (CESL) 114 is deposited over the semiconductor substrate 100 and over the MOS transistor 200. Preferably, the CESL 114 is a silicon nitride layer. According to the preferred embodiment of this invention, the CESL 114 has a thickness of about 200-1000 angstroms, more preferably 380 angstroms.

After the deposition of the CESL 114, a chemical vapor deposition (CVD) such as a sub-atmospheric chemical vapor deposition (SACVD) is carried out to deposit a SACVD oxide layer 116 over the CESL 114. According to the preferred embodiment of this invention, the SACVD oxide layer 116 has a thickness of about 1000-2500 angstroms, preferably 2000 angstroms.

Subsequently, another CVD process utilizing tetra-ethyl-ortho-silicate (TEOS) as precursor is performed to deposit a phosphorus-doped silicate glass (PSG) dielectric layer 118 over the SACVD oxide layer 116. According to the preferred embodiment of this invention, after the deposition of the PSG dielectric layer 118, the top surface of the PSG dielectric layer 118 is subjected to a chemical mechanical polishing (CMP) process to increase the process window of subsequent lithographic process. After the CMP process, the remaining thickness of the PSG dielectric layer 118 is in a range between 2000 angstroms and 2500 angstroms.

Figure 3:
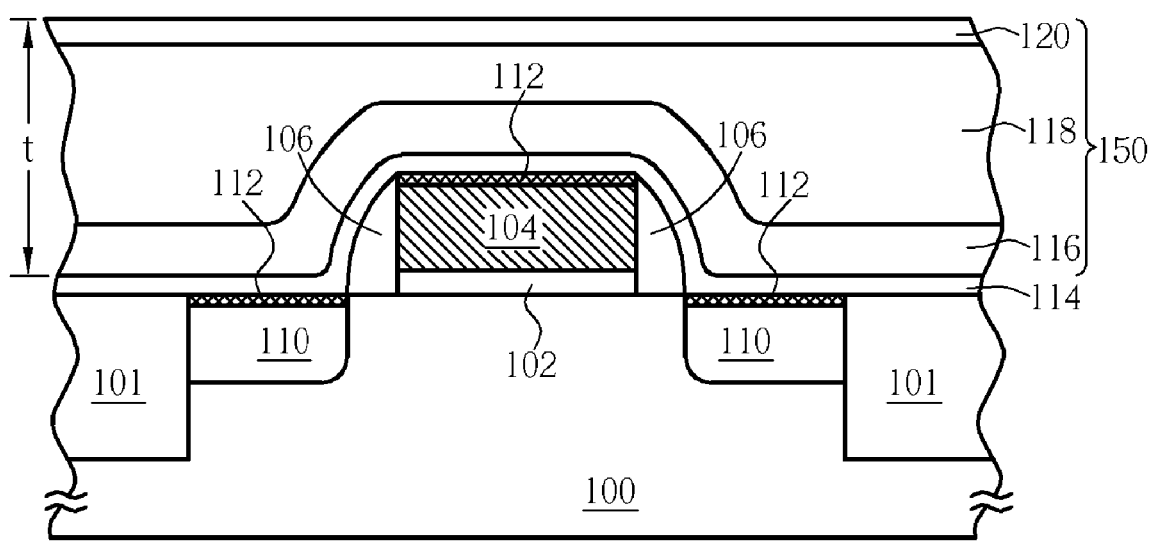

As shown in FIG. 3, after the CMP of the PSG dielectric layer 118, a TEOS-based un-doped silicate glass (USG) cap oxide layer 120 is deposited over the planarized PSG dielectric layer 118 by conventional CVD methods.

The SACVD oxide layer 116, the chemical mechanical polished PSG dielectric layer 118 and the USG cap oxide layer 120 are together referred to as an inter-layer dielectric (ILD) layer 150. According to the preferred embodiment of this invention, the combination of the thickness of the SACVD oxide layer 116, the thickness of the chemical mechanical polished PSG dielectric layer 118, and the thickness of the USG cap oxide layer 120, i.e., the combined thickness t of the ILD layer 150, is substantially constant, wherein t is preferably 5000 angstroms.

It is one salient feature of the present invention that the etching rate of the USG cap oxide layer 120 is smaller than the etching rate of the underlying PSG dielectric layer 118.

Due to the nature and characteristic of the CMP process, the remaining thickness of the polished PSG dielectric layer 118 may slightly varies wafer-by-wafer. The deviation of the remaining thickness of the PSG dielectric layer caused by the CMP process is compensated by the following CVD deposition of the USG cap oxide layer 120, thereby maintaining the aforesaid substantially constant thickness t of the ILD layer 150. According to the preferred embodiment of this invention, the USG cap oxide layer 120 has a thickness of about 500-2500 angstroms, preferably 500-2000 angstroms.

Figure 4:
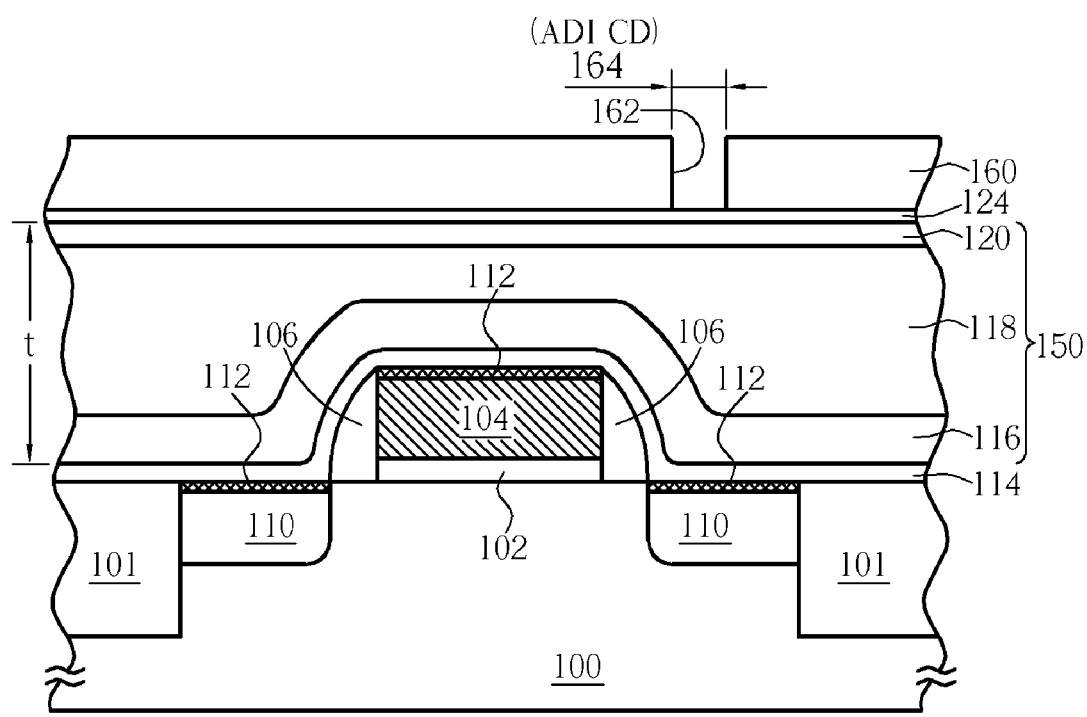

As shown in FIG. 4, after the deposition of the USG cap oxide layer 120, a bottom anti-reflection coating (BARC) 124 is formed. It is understood that in some cases the BARC 124 may be omitted. Thereafter, a photoresist layer 160 is formed on the BARC 124. A lithographic process including steps of exposure and development is performed to form an opening 162 in the photoresist layer 160. The opening 162 has an ADI CD, for example, ADI CD=90 nm.

Figure 5:
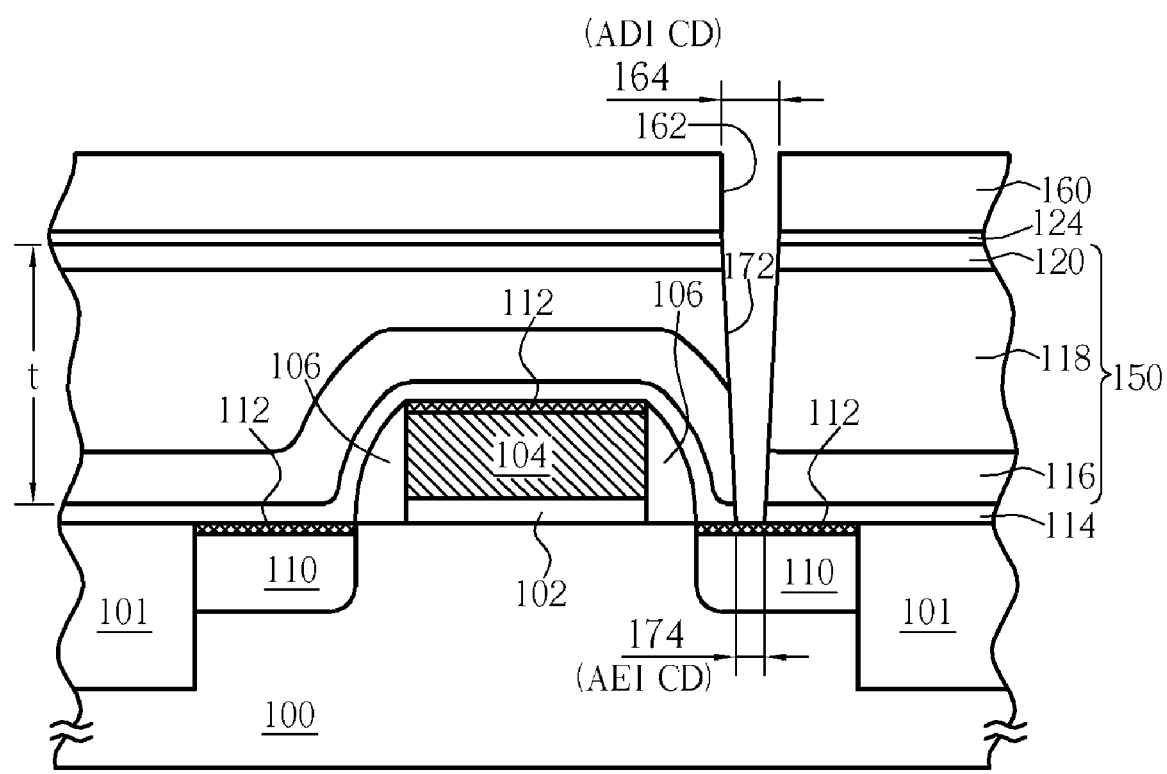

As shown in FIG. 5, using the patterned photoresist layer 160 as an etching hard mask, a first dry etching process is carried out to etch the BARC 124, the ILD layer 150 stopping on the CESL 114. A second dry etching process is then carried out to etch the exposed CESL 114, thereby exposing a portion of the underlying source/drain region 110 and thus forming a tapered contact hole 172. As specifically indicated in FIG. 5, the tapered contact hole 172 has an AEI CD 174 at its bottom.

According to the preferred embodiment of this invention, by way of example, the contact hole 172 is referred to as the Nc contact of a SRAM device. In such case that the ADI CD 164 is about 90 nm, the AEI CD 174 is approximately 70 nm ideally (standard: 70±3 nm). However, with the same lithographic process and the same etching conditions, if the thickness of the USG cap oxide layer 120 is less than 500 angstroms, for example 250 angstroms, the AEI CD 174 gets larger, for example, 80 nm, which is out of specification. The increased AEI CD 174 may cause contact-gate shorting and malfunction of the SRAM device.

Accordingly, it is one salient feature of the present invention that for 65 nm SRAM process, the thickness of the USG cap oxide layer 120 is greater than 500 angstroms in order to restrain the AEI CD 174 and to prevent the contact-gate shorting.

On the other hand, if the thickness of the USG cap oxide layer 120 is too thick, the AEI CD 174 may be too small and thus adversely affecting the contact resistance and device performance. Therefore, it is one salient feature of the present invention that with the same etching conditions, the ADI CD 164 is properly altered wafer-by-wafer or lot-by-lot based on the thickness of the USG cap oxide layer 120.

According to the preferred embodiment of this invention, byway of example, the contact hole 172 is referred to as the Nc contact of a SRAM device and that the ADI CD 164 is about 90 nm. If the thickness of the USG cap oxide layer 120 is greater than 1000 angstroms, for example, 1200 angstroms, then with the same etching recipe and conditions, the AEI CD 174 may be about 60 nm (standard: 70±3 nm). To remedy this, the ADI CD 164 is adjusted and increased to about 92-93 nm, for example, with the same etching recipe and conditions.

Figure 6:
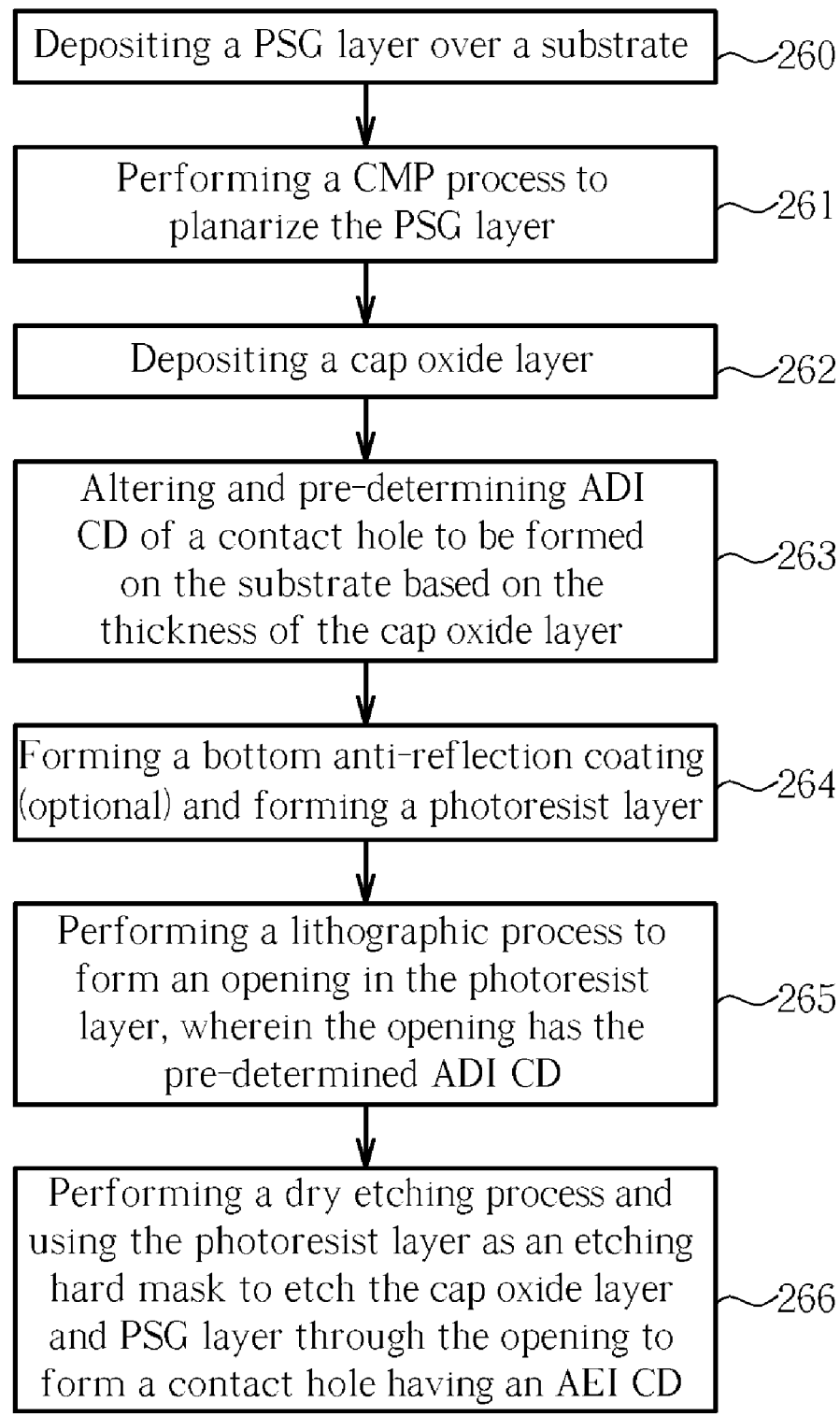
FIG. 6 is a flow chart showing an automatic process control method that is capable of acquiring a standard AEI CD that meets the specification of standard, wherein the ADI CD is altered based on the thickness of the USG cap oxide layer without changing the etching recipe and conditions.

In light of the above, this invention provides an automatic process control method that is capable of acquiring a standard AEI CD that meets the specification of standard. The ADI CD 164 is altered based on the thickness of the USG cap oxide layer 120 without changing the etching recipe and conditions. The flow chart is demonstrated in FIG. 6, wherein the automatic process control method generally comprises the following steps:

Step 260: depositing a PSG dielectric layer over a substrate.

Step 261: performing a CMP process to planarize the PSG dielectric layer, wherein the remaining PSG dielectric layer has a first thickness.

Step 262: depositing a TEOS-based USG cap oxide layer having a second thickness, wherein the combination of the first thickness and the second thickness is substantially constant.

Step 263: altering and pre-determining an ADI CD of a contact hole to be formed on the substrate based on the second thickness of the TEOS-based USG cap oxide layer.

Step 264: forming a bottom anti-reflection coating (BARC) (optional) on the TEOS-based USG cap oxide layer and then forming a photoresist layer on the BARC.

Step 265: performing a lithographic process to form an opening in the photoresist layer, wherein the opening has the pre-determined ADI CD.

Step 266: performing a dry etching process and using the photoresist layer as an etching hard mask to etch the BARC, the TEOS-based USG cap oxide layer and the PSG dielectric layer through the opening to form a contact hole therein, wherein the contact hole has an AEI CD.

Figure 7:
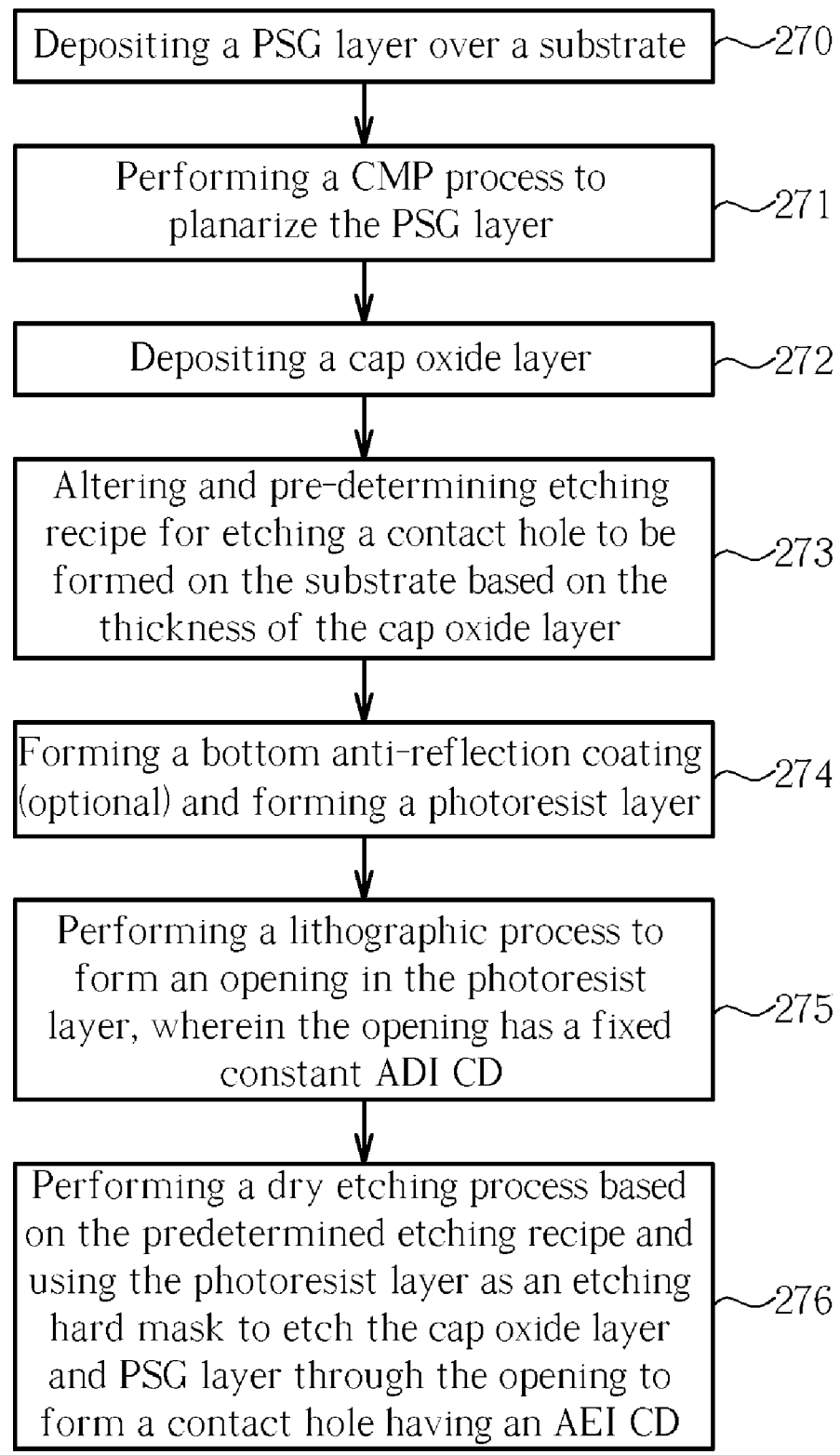
FIG. 7 is a flow chart showing an automatic process control method that is capable of acquiring a standard AEI CD that meets the specification of standard, wherein the etching recipe is altered based on the thickness of the USG cap oxide layer without changing the ADI CD.

From one aspect, this invention provides an automatic process control method that is capable of acquiring a standard AEI CD that meets the specification of standard, wherein the etching recipe is altered based on the thickness of the USG cap oxide layer 120 without changing the ADI CD 164. The flow chart is demonstrated in FIG. 7, wherein the automatic process control method generally comprises the following steps:

Step 270: depositing a PSG dielectric layer over a substrate.

Step 271: performing a CMP process to planarize the PSG dielectric layer, wherein the remaining PSG dielectric layer has a first thickness.

Step 272: depositing a TEOS-based USG cap oxide layer having a second thickness, wherein the combination of the first thickness and the second thickness is substantially constant.

Step 273: altering and pre-determining etching recipe for a contact hole to be formed on the substrate based on the second thickness of the TEOS-based USG cap oxide layer.

Step 274: forming a bottom anti-reflection coating (BARC) (optional) on the TEOS-based USG cap oxide layer and then forming a photoresist layer on the BARC.

Step 275: performing a lithographic process to form an opening in the photoresist layer, wherein the opening has a fixed constant ADI CD.

Step 276: performing a dry etching process and using the photoresist layer as an etching hard mask to etch the BARC, the TEOS-based USG cap oxide layer and the PSG dielectric layer through the opening to form a contact hole therein, wherein the contact hole has an AEI CD.

Figure 8:
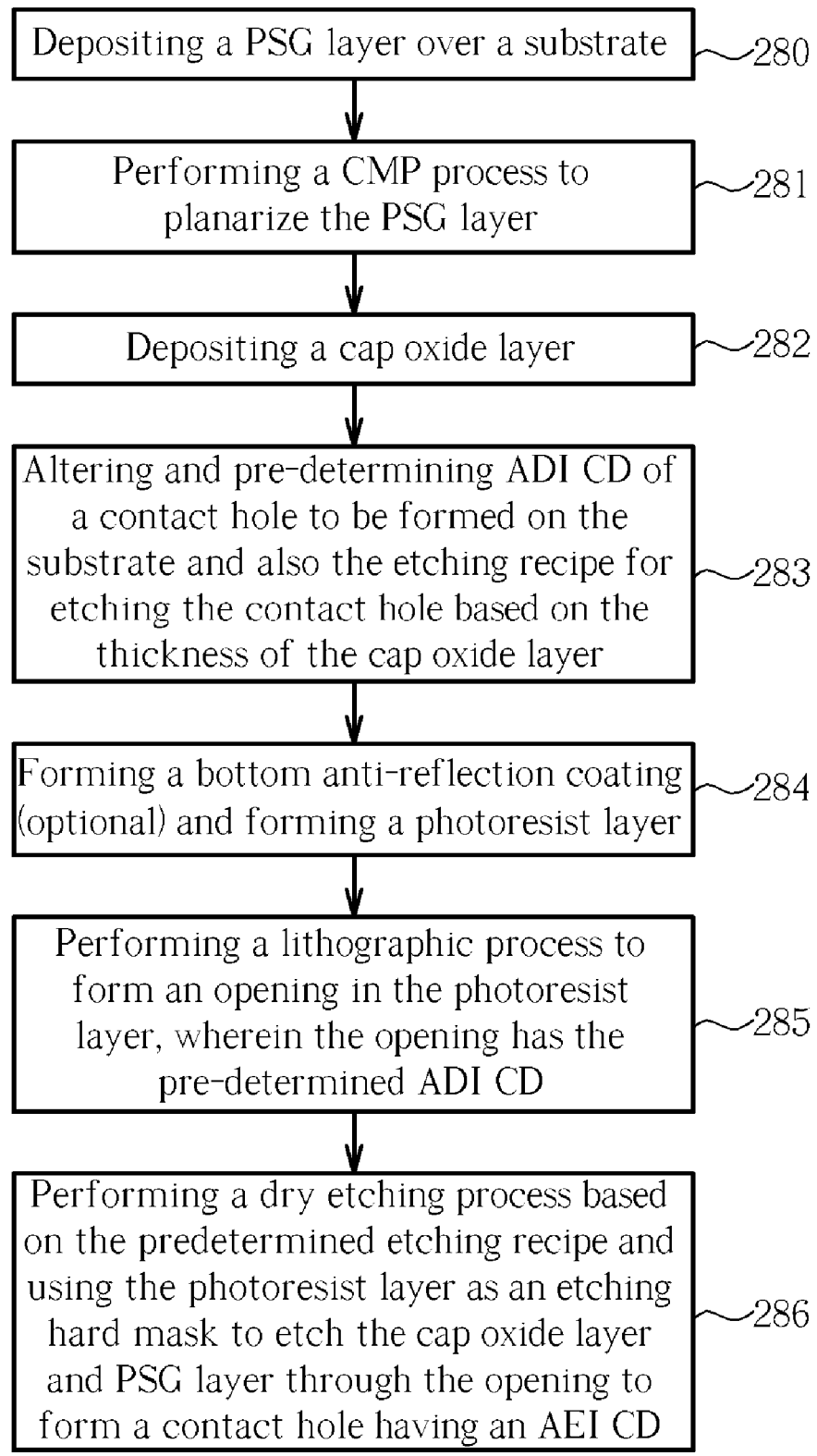
FIG. 8 is a flow chart showing an automatic process control method that is capable of acquiring a standard AEI CD that meets the specification of standard, wherein the etching recipe and the ADI CD 164 are both altered based on the thickness of the USG cap oxide layer.

From another aspect, this invention provides an automatic process control method that is capable of acquiring a standard AEI CD that meets the specification of standard, wherein the etching recipe and the ADI CD 164 are both altered based on the thickness of the USG cap oxide layer 120. The flow chart is demonstrated in FIG. 8, wherein the automatic process control method generally comprises the following steps:

Step 280: depositing a PSG dielectric layer over a substrate.

Step 281: performing a CMP process to planarize the PSG dielectric layer, wherein the remaining PSG dielectric layer has a first thickness.

Step 282: depositing a TEOS-based USG cap oxide layer having a second thickness, wherein the combination of the first thickness and the second thickness is substantially constant.

Step 283: altering and pre-determining both an ADI CD of a contact hole to be formed on the substrate and the etching recipe for etching the contact hole based on the second thickness of the TEOS-based USG cap oxide layer.

Step 284: forming a bottom anti-reflection coating (BARC) (optional) on the TEOS-based USG cap oxide layer and then forming a photoresist layer on the BARC.

Step 285: performing a lithographic process to form an opening in the photoresist layer, wherein the opening has the pre-determined ADI CD.

Step 286: performing a dry etching process and using the photoresist layer as an etching hard mask to etch the BARC, the TEOS-based USG cap oxide layer and the PSG dielectric layer through the opening to form a contact hole therein, wherein the contact hole has an AEI CD.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for controlling after-etch-inspection critical dimension (AEI CD) of a contact hole, comprising:

depositing a dielectric layer over a substrate;

performing a chemical mechanical polishing (CMP) process to planarize the dielectric layer, wherein a remaining dielectric layer has a first thickness;

depositing a cap oxide layer having a second thickness, wherein a combination of the first thickness and the second thickness is substantially constant;

altering and pre-determining an after-develop-inspection critical dimension (ADI CD) of a contact hole to be formed on the substrate based on the second thickness of the cap oxide layer;

forming a photoresist layer on the cap oxide layer;

performing a lithographic process to form an opening in the photoresist layer, wherein the opening has the pre-determined after-develop-inspection critical dimension (ADI CD); and performing a dry etching process and using the photoresist layer as an etching hard mask to etch the cap oxide layer and the dielectric layer through the opening to form a contact hole therein, wherein the contact hole has an after-etch-inspection critical dimension (AEI CD).

2. The method according to claim 1 wherein the dielectric layer is a TEOS-based, phosphorus-doped silicate glass (PSG) dielectric layer.

3. The method according to claim 1 wherein prior to depositing the dielectric layer, a sub-atmospheric chemical vapor deposition (SACVD) is performed to deposit a SACVD oxide layer over the substrate.

4. The method according to claim 3 wherein the SACVD oxide layer has a thickness of 1000-2500 angstroms.

5. The method according to claim 1 wherein prior to depositing the dielectric layer, a silicon nitride layer is deposited over the substrate.

6. The method according to claim 5 wherein the silicon nitride layer acts as a contact etch stop layer (CESL).

7. The method according to claim 5 wherein the CESL has thickness of 200-1000 angstroms.

8. The method according to claim 1 wherein the cap oxide layer is a TEOS-based, un-doped silicate glass (USG) layer.

9. The method according to claim 1 wherein the cap oxide layer comprises silicon oxide and silicon nitride.

10. The method according to claim 1 wherein the cap oxide layer has a etching rate that is lower than that of the dielectric layer.

11. The method according to claim 1 wherein the first thickness ranges between 2000 angstroms and 2500 angstroms.

12. The method according to claim 1 wherein the second thickness ranges between 500 angstroms and 2500 angstroms.

13. A method for controlling after-etch-inspection critical dimension (AEI CD) of a contact hole, comprising:
depositing a dielectric layer over a substrate;
performing a chemical mechanical polishing (CMP) process to planarize the dielectric layer, wherein a remaining dielectric layer has a first thickness;
depositing a cap oxide layer having a second thickness, wherein a combination of the first thickness and the second thickness is substantially constant;
altering and pre-determining an after-develop-inspection critical dimension (ADI CD) of a contact hole to be formed on the substrate and/or etching recipe for etching the contact hole based on the second thickness of the cap oxide layer;
forming a photoresist layer on the cap oxide layer;
performing a lithographic process to form an opening in the photoresist layer, wherein the opening has the after-develop-inspection critical dimension (ADI CD); and
performing a dry etching process and using the photoresist layer as an etching hard mask to etch the cap oxide layer and the dielectric layer through the opening to form a contact hole therein, wherein the contact hole has an after-etch-inspection critical dimension (AEI CD).

14. The method according to claim 13 wherein the dielectric layer is a TEOS-based, phosphorus-doped silicate glass (PSG) dielectric layer.

15. The method according to claim 13 wherein the cap oxide layer comprises silicon oxide and silicon nitride.

16. The method according to claim 13 wherein the cap oxide layer has a etching rate that is lower than that of the dielectric layer.

17. The method according to claim 13 wherein prior to depositing the dielectric layer, a sub-atmospheric chemical vapor deposition (SACVD) is performed to deposit a SACVD oxide layer over the substrate.

18. The method according to claim 17 wherein the SACVD oxide layer has a thickness of 1000-2500 angstroms.

19. The method according to claim 13 wherein prior to depositing the dielectric layer, a silicon nitride layer is deposited over the substrate.

20. The method according to claim 19 wherein the silicon nitride layer acts as a contact etch stop layer (CESL).

21. The method according to claim 19 wherein the CESL has thickness of 200-1000 angstroms.

22. The method according to claim 13 wherein the cap oxide layer is a TEOS-based, un-doped silicate glass (USG) layer.

23. The method according to claim 13 wherein the first thickness ranges between 2000 angstroms and 2500 angstroms.

24. The method according to claim 13 wherein the second thickness ranges between 500 angstroms and 2500 angstroms.

25. A method for controlling after-etch-inspection critical dimension (AEI CD) of a contact hole, comprising:
depositing a dielectric layer over a substrate;
performing a chemical mechanical polishing (CMP) process to planarize the dielectric layer, wherein a remaining dielectric layer has a first thickness;
depositing a cap oxide layer having a second thickness, wherein a combination of the first thickness and the second thickness is substantially constant;
altering and pre-determining etching recipe for etching contact hole based on the second thickness of the cap oxide layer;
forming a photoresist layer on the cap oxide layer;
performing a lithographic process to form an opening in the photoresist layer, wherein the opening has an after-develop-inspection critical dimension (ADI CD); and
performing a dry etching process using the pre-determined etching recipe and using the photoresist layer as an etching hard mask to etch the cap oxide layer and the dielectric layer through the opening to form a contact hole therein, wherein the contact hole has an after-etch-inspection critical dimension (AEI CD).

26. The method according to claim 25 wherein the dielectric layer is a TEOS-based, phosphorus-doped silicate glass (PSG) dielectric layer.

27. The method according to claim 25 wherein the cap oxide layer comprises silicon oxide and silicon nitride.

28. The method according to claim 25 wherein the cap oxide layer has a etching rate that is lower than that of the dielectric layer.

29. The method according to claim 25 wherein prior to depositing the dielectric layer, a sub-atmospheric chemical vapor deposition (SACVD) is performed to deposit a SACVD oxide layer over the substrate.

30. The method according to claim 29 wherein the SACVD oxide layer has a thickness of 1000-2500 angstroms.

31. The method according to claim 25 wherein prior to depositing the dielectric layer, a silicon nitride layer is deposited over the substrate.

32. The method according to claim 31 wherein the silicon nitride layer acts as a contact etch stop layer (CESL).

33. The method according to claim 32 wherein the CESL has thickness of 200-1000 angstroms.

34. The method according to claim 25 wherein the cap oxide layer is a TEOS-based, un-doped silicate glass (USG) layer.

35. The method according to claim 25 wherein the first thickness ranges between 2000 angstroms and 2500 angstroms.

36. The method according to claim 25 wherein the second thickness ranges between 500 angstroms and 2500 angstroms.

* * * * *